United States Patent
Genmei

(10) Patent No.: US 10,502,542 B2
(45) Date of Patent: Dec. 10, 2019

(54) PIEZOELECTRIC ELEMENT AND PIEZOELECTRIC SENSOR

(71) Applicant: Murata Manufacturing Co., Ltd., Nagaokakyo-shi, Kyoto-fu (JP)

(72) Inventor: Yuya Genmei, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 187 days.

(21) Appl. No.: 15/673,444

(22) Filed: Aug. 10, 2017

(65) Prior Publication Data

US 2017/0363409 A1 Dec. 21, 2017

Related U.S. Application Data

(63) Continuation of application No. PCT/JP2015/076397, filed on Sep. 17, 2015.

(30) Foreign Application Priority Data

Feb. 18, 2015 (JP) ................... 2015-029476

(51) Int. Cl.
*G01B 7/16* (2006.01)
*H01L 41/047* (2006.01)
(Continued)

(52) U.S. Cl.
CPC .............. *G01B 7/16* (2013.01); *H01L 41/047* (2013.01); *H01L 41/0533* (2013.01);
(Continued)

(58) Field of Classification Search
CPC ... G01B 7/16; H01L 41/0533; H01L 41/0471; H01L 41/0472; H01L 41/1132
See application file for complete search history.

(56) References Cited

U.S. PATENT DOCUMENTS

| 2,911,370 A * | 11/1959 | Kulcsar ................. C04B 35/46 252/62.9 PZ |
| 2003/0202672 A1* | 10/2003 | Yamauchi ................ H04R 1/06 381/190 |
| 2006/0028095 A1 | 2/2006 | Maruyama et al. |
| 2011/0109204 A1* | 5/2011 | Tajitsu ................. H01L 41/193 310/348 |

(Continued)

FOREIGN PATENT DOCUMENTS

| JP | 56-144585 A | 11/1981 |
| JP | 62-156503 A | 7/1987 |

(Continued)

OTHER PUBLICATIONS

Official Communication issued in International Patent Application No. PCT/JP2015/076397, dated Dec. 22, 2015.
(Continued)

*Primary Examiner* — Nathaniel J Kolb
(74) *Attorney, Agent, or Firm* — Keating & Bennett, LLP

(57) ABSTRACT

A piezoelectric element includes a laminate including first and second piezoelectric layers with respective polarization directions in a thickness direction and an elastic layer provided between the first piezoelectric layer and the second piezoelectric layer, first and second terminal electrodes that are provided on an external surface of the laminate, a first detection electrode provided on a positive polar surface of the first piezoelectric layer, a second detection electrode provided on a negative polar surface of the first piezoelectric layer, a third detection electrode provided on a positive polar surface of the second piezoelectric layer, and a fourth detection electrode provided on a negative polar surface of the second piezoelectric layer. The first detection electrode and the fourth detection electrode are connected to the first terminal electrode. The second detection electrode and the third detection electrode are connected to the second terminal electrode.

20 Claims, 4 Drawing Sheets

(51) Int. Cl.
*H01L 41/053* (2006.01)
*H01L 41/113* (2006.01)
*H01L 41/187* (2006.01)
*H01L 41/23* (2013.01)
*H01L 41/273* (2013.01)
*H01L 41/29* (2013.01)
*H01L 41/313* (2013.01)
*H01L 41/43* (2013.01)
*H01L 41/47* (2013.01)

(52) U.S. Cl.
CPC ...... *H01L 41/1132* (2013.01); *H01L 41/1876* (2013.01); *H01L 41/23* (2013.01); *H01L 41/273* (2013.01); *H01L 41/29* (2013.01); *H01L 41/313* (2013.01); *H01L 41/43* (2013.01); *H01L 41/47* (2013.01)

(56) References Cited

U.S. PATENT DOCUMENTS

| | | | |
|---|---|---|---|
| 2014/0049137 A1* | 2/2014 | Ando | G01B 7/16 310/330 |
| 2015/0035411 A1 | 2/2015 | Kawamura et al. | |

FOREIGN PATENT DOCUMENTS

| | | |
|---|---|---|
| JP | 62-238417 A | 10/1987 |
| JP | 08-293631 A | 11/1996 |
| JP | 2006-038710 A | 2/2006 |
| JP | 2006-048302 A | 2/2006 |
| JP | 2009-295788 A | 12/2009 |
| JP | 2015-015500 A | 1/2015 |
| WO | 2013/157508 A1 | 10/2013 |

OTHER PUBLICATIONS

Official Communication issued in Japanese Patent Application No. 2017-500272, dated Jun. 4, 2019.

* cited by examiner

PIEZOELECTRIC ELEMENT AND PIEZOELECTRIC SENSOR

CROSS REFERENCE TO RELATED APPLICATIONS

This application claims the benefit of priority to Japanese Patent Application No. 2015-029476 filed on Feb. 18, 2015 and is a Continuation application of PCT Application No. PCT/JP2015/076397 filed on Sep. 17, 2015. The entire contents of each application are hereby incorporated herein by reference.

BACKGROUND OF THE INVENTION

1. Field of the Invention

The present invention relates to a piezoelectric element and a piezoelectric sensor including the piezoelectric element.

2. Description of the Related Art

As sensors for detecting the deformation of an object, piezoelectric sensors utilizing piezoelectric phenomena have been known.

For example, Japanese Unexamined Patent Application Publication No. JPS62-156503 discloses a piezoelectric sensor for detecting whether a target object such as the fingertip of a robot or the joint of a human being is bent. The piezoelectric sensor disclosed in Japanese Unexamined Patent Application Publication No. JPS62-156503 has a bimorph structure including an upper piezoelectric thin film and a lower piezoelectric thin film. Specifically, when the upper piezoelectric thin film expands and the lower piezoelectric thin film contracts, that is, a piezoelectric substances deform, an electric charge generated by the deformation is detected as a bending.

As disclosed in Japanese Unexamined Patent Application Publication No. JPS62-156503, a piezoelectric substance has pyroelectricity in which an electric charge is generated in accordance with a change in temperature. In a case where the piezoelectric sensor is used under an environment where there is a temperature change, the piezoelectric sensor therefore detects not only an electric charge generated in response to the deformation of a piezoelectric substance but also an electric charge generated in response to a thermal gradient caused by a temperature change. An electric charge generated in response to a thermal gradient becomes noise at the time of detection of a bending. In the piezoelectric sensor disclosed in Japanese Unexamined Patent Application Publication No. JPS62-156503, the setting of polarization directions of the piezoelectric substances and the setting of a polarity of an extraction electrode are devised to cancel an electric charge generated in response to a thermal gradient using the upper piezoelectric substance and the lower piezoelectric substance. As a result, only an electric charge generated in response to the deformations of the piezoelectric substances can be detected.

However, the piezoelectric sensor disclosed in Japanese Unexamined Patent Application Publication No. JPS62-156503 cannot be used in a case where both of an upper piezoelectric substance and a lower piezoelectric substance are pulled by a target object and deform (expand or contract), for example, when the target object deflects. The reason for this is that the piezoelectric sensor disclosed in Japanese Unexamined Patent Application Publication No. JPS62-156503 is used in a case where the upper piezoelectric substance expands and the lower piezoelectric substance contracts. If the piezoelectric sensor disclosed in Japanese Unexamined Patent Application Publication No. JPS62-156503 is used in the above-described case where a piezoelectric sensor deforms in a different manner, a positive electric charge and a negative electric charge are generated in a different manner.

Accordingly, if the piezoelectric sensor disclosed in Japanese Unexamined Patent Application Publication No. JPS62-156503, which is designed to cancel an electric charge generated in response to a thermal gradient, is used to detect the deflection of a target object, a problem about pyroelectricity is solved but another problem arises. That is, an electric charge generated in response to deflection is also canceled by the upper piezoelectric substance and the lower piezoelectric substance and the detection of the deflection therefore becomes difficult. If a piezoelectric sensor is designed not to cancel an electric charge using an upper piezoelectric substance and a lower piezoelectric substance to prioritize a deflection detection function, an electric charge generated in response to a thermal gradient cannot be canceled and noise is generated. Thus, it is difficult to achieve both the cancellation of an electric charge generated in response to a thermal gradient and the sensitive detection of an electric charge generated in response to deflection in a piezoelectric sensor in the related art.

SUMMARY OF THE INVENTION

A piezoelectric element according to a preferred embodiment of the present invention includes a laminate including a first piezoelectric layer and a second piezoelectric layer with respective polarization directions in a thickness direction and an elastic layer provided between the first piezoelectric layer and the second piezoelectric layer, a first terminal electrode and a second terminal electrode which are provided on an external surface of the laminate, a first detection electrode provided on a positive polar surface of the first piezoelectric layer, a second detection electrode provided on a negative polar surface of the first piezoelectric layer, a third detection electrode provided on a positive polar surface of the second piezoelectric layer, and a fourth detection electrode provided on a negative polar surface of the second piezoelectric layer. The first detection electrode and the fourth detection electrode are connected to the first terminal electrode. The second detection electrode and the third detection electrode are connected to the second terminal electrode.

A piezoelectric sensor according to a preferred embodiment of the present invention includes the piezoelectric element and a deformation detection target object on which the piezoelectric element is disposed. A deformation of the target object is detected on the basis of a difference in a degree of expansion between the first piezoelectric layer and the second piezoelectric layer which is generated by the elastic layer.

According to preferred embodiments of the present invention, it is possible to detect an electric charge generated in response to deflection with high sensitivity while canceling an electric charge generated in response to a thermal gradient.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Piezoelectric elements according to preferred embodiments of the present invention and piezoelectric sensors according to preferred embodiments of the present invention will be described below with reference to the accompanying drawings.

First Preferred Embodiment

Figure 1:
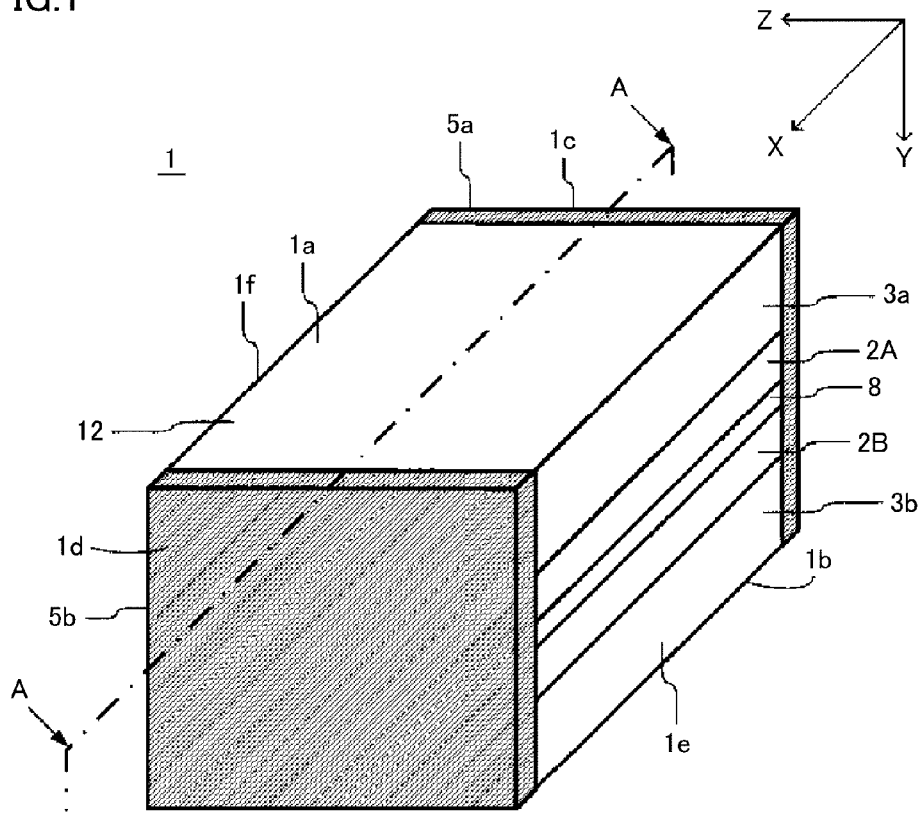
FIG. 1 is a perspective view of a piezoelectric element according to a first preferred embodiment of the present invention.

FIG. 1 is a perspective view of a piezoelectric element 1 according to the first preferred embodiment of the present invention. In FIG. 1, an X-axis direction is defined as a length direction, a Y-axis direction is defined as a thickness direction, and a Z-axis direction is defined as a width direction.

As illustrated in FIG. 1, the piezoelectric element 1 preferably is a rectangular or substantially rectangular parallelepiped, and includes a first main surface 1a located at one end in the thickness direction, a second main surface 1b located at the other end in the thickness direction, a first end surface 1c located at on end in the length direction, a second end surface 1d located at the other end in the length direction, a first side surface 1e located at one end in the width direction, and a second side surface 1f located at the other end in the width direction. The piezoelectric element 1 includes a laminate 12 obtained by laminating a first exterior body 3a, a first piezoelectric layer 2A, an elastic layer 8, a second piezoelectric layer 2B, and a second exterior body 3b in the thickness direction. In the first preferred embodiment, the dimension of the laminate 12 in the length direction is larger than the dimension of the laminate 12 in the width direction.

On the first end surface 1c of the laminate 12, a first terminal electrode 5a is provided. On the second end surface 1d of the laminate 12, a second terminal electrode 5b is provided. The first terminal electrode 5a and the second terminal electrode 5b extend onto portions of the first main surface 1a, the second main surface 1b, the first side surface 1e, and the second side surface 1f of the laminate 12.

Figure 2:
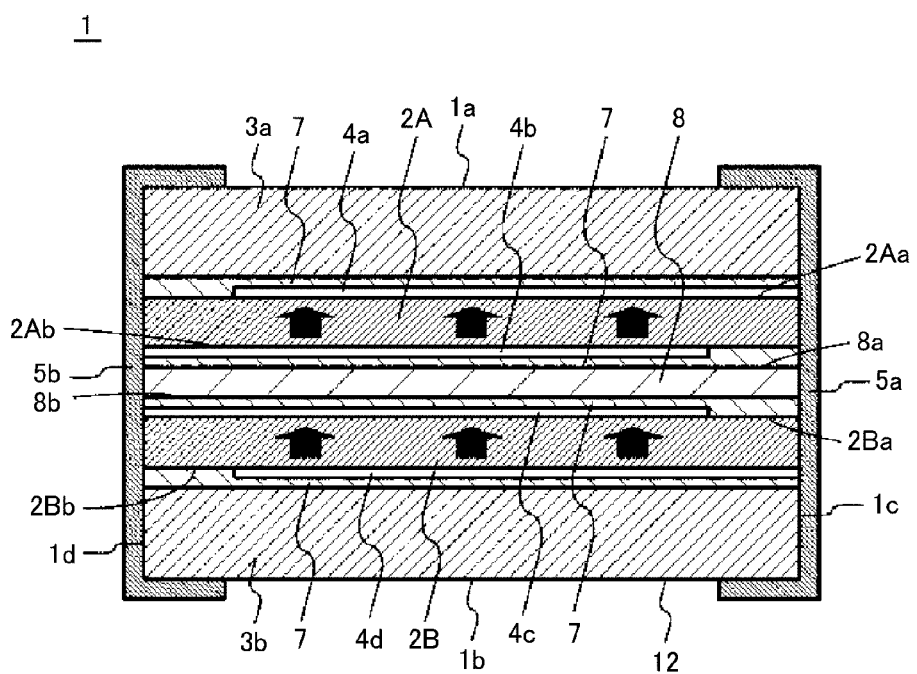
FIG. 2 is a cross-sectional view of a piezoelectric element according to the first preferred embodiment of the present invention taken along a line A-A in FIG. 1.

FIG. 2 is a cross-sectional view of the piezoelectric element 1 taken along a line A-A in FIG. 1.

As illustrated in FIG. 2, the first piezoelectric layer 2A includes a first main surface 2Aa and a second main surface 2Ab, and the second piezoelectric layer 2B includes a first main surface 2Ba and a second main surface 2Bb. Each of the first piezoelectric layer 2A and the second piezoelectric layer 2B is made of piezoelectric ceramics such as lead zirconate titanate.

The first piezoelectric layer 2A and the second piezoelectric layer 2B are subjected to polarization processing. In the first piezoelectric layer 2A and the second piezoelectric layer 2B, the thickness direction is set as a polarization direction. More specifically, the polarization direction of the first piezoelectric layer 2A is a direction from the second main surface 2Ab to the first main surface 2Aa, and the polarization direction of the second piezoelectric layer 2B is a direction from the second main surface 2Bb to the first main surface 2Ba. In a case where a polarization direction is represented by an arrow, a main surface on which a starting point of the arrow is located is defined as a negative polar surface and a main surface on which and end point of the arrow is located is defined as a positive polar surface.

In the first preferred embodiment, the first main surface 2Aa of the first piezoelectric layer 2A and the first main surface 2Ba of the second piezoelectric layer 2B are positive polar surfaces, and the second main surface 2Ab of the first piezoelectric layer 2A and the second main surface 2Bb of the second piezoelectric layer 2B are negative polar surfaces. The polarization directions of the first piezoelectric layer 2A and the second piezoelectric layer 2B are preferably the same direction.

The polarization directions may be a direction from the first main surface 2Aa to the second main surface 2Ab and a direction from the first main surface 2Ba to the second main surface 2Bb. In this case, the second main surface 2Ab of the first piezoelectric layer 2A and the second main surface 2Bb of the second piezoelectric layer 2B are positive polar surfaces, and the first main surface 2Aa of the first piezoelectric layer 2A and the first main surface 2Ba of the second piezoelectric layer 2B are negative polar surfaces.

Between the first piezoelectric layer 2A and the second piezoelectric layer 2B, the elastic layer 8 is provided. More specifically, the plate-shaped elastic layer 8 is joined to the second main surface 2Ab of the first piezoelectric layer 2A and the first main surface 2Ba of the second piezoelectric layer 2B via an adhesive 7.

The elastic layer 8 is made of an elastic material such as a urethane resin or a silicone resin. Instead of a urethane resin or a silicone resin, rubber may be used for the elastic layer 8. The Young's modulus of the elastic layer 8 is preferably lower than that of the first piezoelectric layer 2A and the second piezoelectric layer 2B. In addition, the Young's modulus of the elastic layer 8 is preferably lower than that of the adhesive 7. The elastic layer 8 may be directly joined to the second main surface 2Ab of the first piezoelectric layer 2A and the first main surface 2Ba of the second piezoelectric layer 2B without the adhesive 7.

In the piezoelectric element 1 according to the first preferred embodiment, the first exterior body 3a is joined to the first main surface 2Aa of the first piezoelectric layer 2A and the second exterior body 3b is joined to the second main surface 2Bb of the second piezoelectric layer 2B. Either or both of the first exterior body 3a and the second exterior body 3b do not necessarily have to be provided. However, in order to prevent the first piezoelectric layer 2A and the second piezoelectric layer 2B from being damaged, the first exterior body 3a and the second exterior body 3b are preferably provided in the piezoelectric element 1.

A first detection electrode 4a is provided on the positive polar surface of the first piezoelectric layer 2A, and a second detection electrode 4b is provided on the negative polar surface of the first piezoelectric layer 2A. A third detection electrode 4c is provided on the positive polar surface of the second piezoelectric layer 2B, and a fourth detection electrode 4d is provided on the negative polar surface of the second piezoelectric layer 2B.

It is important that the first detection electrode 4a provided on the positive polar surface of the first piezoelectric layer 2A and the fourth detection electrode 4d provided on the negative polar surface of the second piezoelectric layer 2B are electrically connected to the first terminal electrode 5a. It is also important that the second detection electrode 4b provided on the negative polar surface of the first piezoelectric layer 2A and the third detection electrode 4c provided on the positive polar surface of the second piezoelectric layer 2B are electrically connected to the second terminal electrode 5b.

Figure 3:
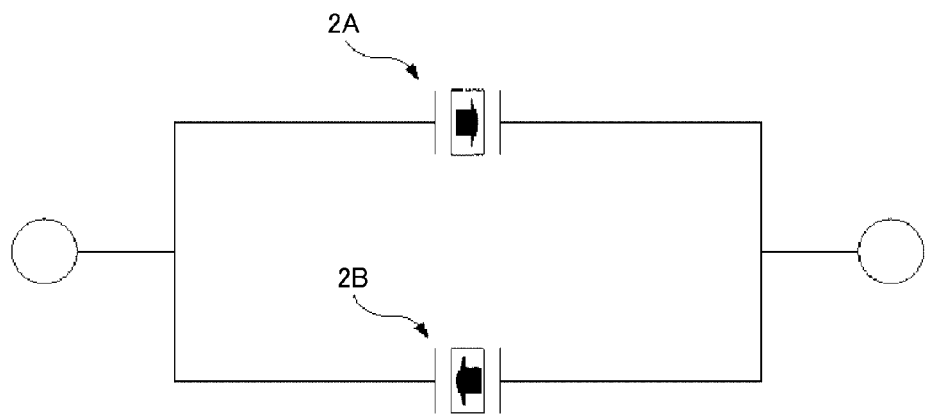
FIG. 3 is an equivalent circuit diagram of a piezoelectric sensor according to the first preferred embodiment of the present invention.

FIG. 3 is an equivalent circuit diagram of a piezoelectric sensor according to the first preferred embodiment of the present invention.

In the equivalent circuit diagram in FIG. 3, the first piezoelectric layer 2A and the second piezoelectric layer 2B are connected in parallel so that the polarization directions thereof are opposite to each other in the piezoelectric element 1. An electric charge generated in response to a thermal gradient is therefore able to be canceled in the piezoelectric element 1.

Both of the second detection electrode 4b and the third detection electrode 4c are connected to the second terminal electrode 5b. Although the second detection electrode 4b and the third detection electrode 4c sandwich the elastic layer 8 and are close to each other, an electric field is not generated across the elastic layer 8 because both of the second detection electrode 4b and the third detection electrode 4c are connected to the second terminal electrode 5b.

Figure 4:
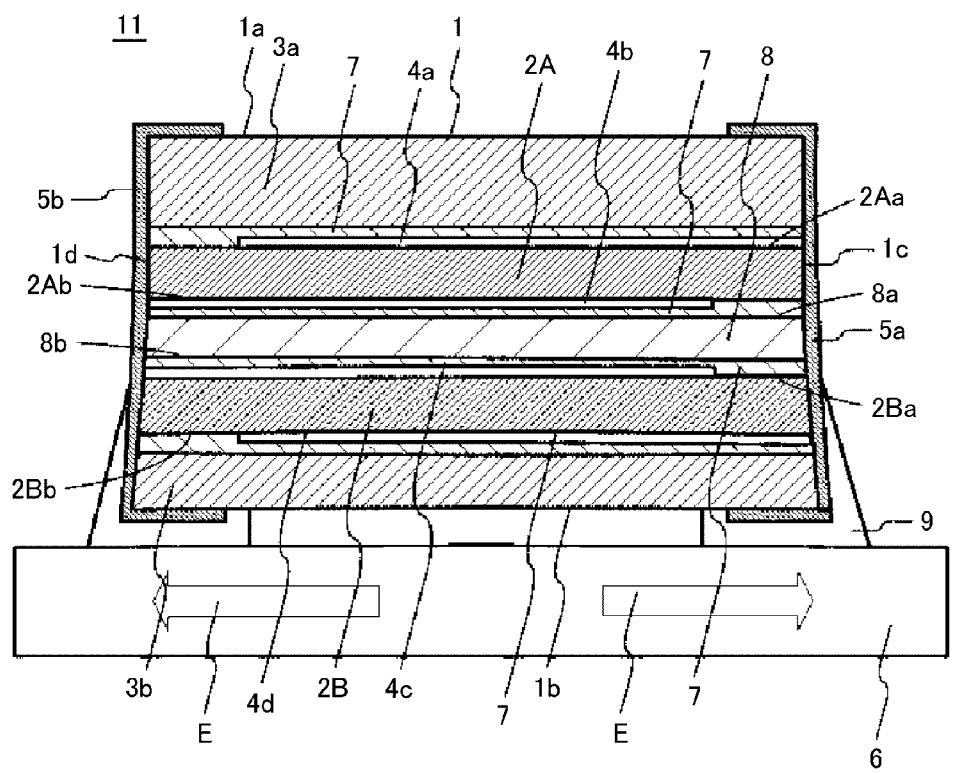
FIG. 4 is a cross-sectional view of a piezoelectric sensor including a piezoelectric element according to the first preferred embodiment of the present invention.

FIG. 4 is a cross-sectional view of a piezoelectric sensor 11 including the piezoelectric element 1 according to the first preferred embodiment of the present invention.

As illustrated in FIG. 4, the piezoelectric sensor 11 is obtained by disposing the piezoelectric element 1 on a substrate that is a target object 6 via a joint 9. The second piezoelectric layer 2B is disposed closer to the target object 6 than the first piezoelectric layer 2A.

As represented by arrows E in FIG. 4, in a case where the target object 6 expands in a planar direction, tensile stresses in the same directions as the arrows E are applied from the joint 9 to the piezoelectric element 1. The second piezoelectric layer 2B disposed on the side of the target object 6 therefore expands.

The elastic layer 8 has a function of absorbing the applied tensile stresses. The amount of tensile stress applied to the first piezoelectric layer 2A, which is across the elastic layer 8 from the target object 6, is therefore small. The degree of deformation of the first piezoelectric layer 2A is therefore smaller than that of the second piezoelectric layer 2B. That is, when the target object 6 expands, the presence of the elastic layer 8 makes a difference in the degree of expansion between the first piezoelectric layer 2A and the second piezoelectric layer 2B.

The piezoelectric sensor 11 detects the deflection of the target object 6 on the basis of the difference in the degree of expansion between the first piezoelectric layer 2A and the second piezoelectric layer 2B that is generated by the elastic layer 8. As described above, since the piezoelectric sensor 11 is designed to cancel electric charges generated at the first piezoelectric layer 2A and the second piezoelectric layer 2B in response to a thermal gradient, the piezoelectric sensor 11 is able to detect electric charges generated in response to the deformations of the first piezoelectric layer 2A and the second piezoelectric layer 2B without being affected by electric charges generated in response to a thermal gradient.

In a case where the elastic layer 8 is not provided in the piezoelectric element 1, the degrees of deformations of the first piezoelectric layer 2A and the second piezoelectric layer 2B become substantially the same and the difference in the degree of expansion between the first piezoelectric layer 2A and the second piezoelectric layer 2B becomes small. Respective electric charges generated by the first piezoelectric layer 2A and the second piezoelectric layer 2B are almost canceled and the deflection of the target object 6 cannot be detected with high sensitivity. The presence of the elastic layer 8 makes possible the sensitive detection of a deflection of the target object 6.

Referring to FIG. 4, the joint 9 extends to a height position at which the second piezoelectric layer 2B is provided in portions corresponding to the first end surface 1c and the second end surface 1d of the piezoelectric element 1. The joint 9 is preferably located below the height position at which the first piezoelectric layer 2A is provided. The joint 9 is more preferably located below the height position at which the elastic layer 8 is provided. The reason for this is that a tensile stress generated in response to the deflection of the target object 6 is applied to the piezoelectric element 1 via the joint 9.

As illustrated in FIG. 4, a clearance for the deposition of the joint 9 is preferably provided between the target object 6 and the piezoelectric element 1 in the piezoelectric sensor 11. This clearance prevents the piezoelectric element 1 from being in direct contact with the target object 6 and has a function of making it difficult for the piezoelectric element 1 to detect noise such as an externally transmitted impact or vibration. The joint 9 is made of solder, adhesive, or the like.

Next, a non-limiting example of a method of manufacturing the piezoelectric element 1 according to the first preferred embodiment of the present invention and the piezoelectric sensor 11 including the piezoelectric element 1 will be described.

First, the first detection electrode 4a and the second detection electrode 4b are formed on the first piezoelectric layer 2A made of, for example, piezoelectric ceramics by screen printing and are calcined. Polarization processing is performed upon a resultant substance to set the thickness direction as a polarization direction. The third detection electrode 4c and the fourth detection electrode 4d are similarly formed on the second piezoelectric layer 2B made of, for example, piezoelectric ceramics by screen printing and are calcined. Polarization processing is performed upon a resultant substance to set the thickness direction as a polarization direction.

The adhesive 7 such as an epoxy resin is applied to the main surfaces of the calcined first piezoelectric layer 2A and the calcined second piezoelectric layer 2B to laminate and integrally join the first exterior body 3a, the first piezoelectric layer 2A, the elastic layer 8, the second piezoelectric layer 2B, and the second exterior body 3b. As a result, the laminate 12 is obtained.

Alternatively, detection electrodes may be formed at a motherboard including piezoelectric layers. After that, the motherboard may be subjected to polarization processing, be joined to an elastic layer and exterior bodies, and be cut into chips so that a plurality of laminates are manufactured at a time.

Subsequently, a thin film made of, for example, Ag is formed on both end surfaces of the laminate 12 by, for example, sputtering. Metallic plating is performed upon the thin film so that the first terminal electrode 5a and the second terminal electrode 5b are formed. As a result, the piezoelectric element 1 is manufactured.

The piezoelectric element 1 is disposed on a substrate that is the target object 6 via the joint 9, so that the creation of the piezoelectric sensor 11 is completed.

Second Preferred Embodiment

Figure 5:
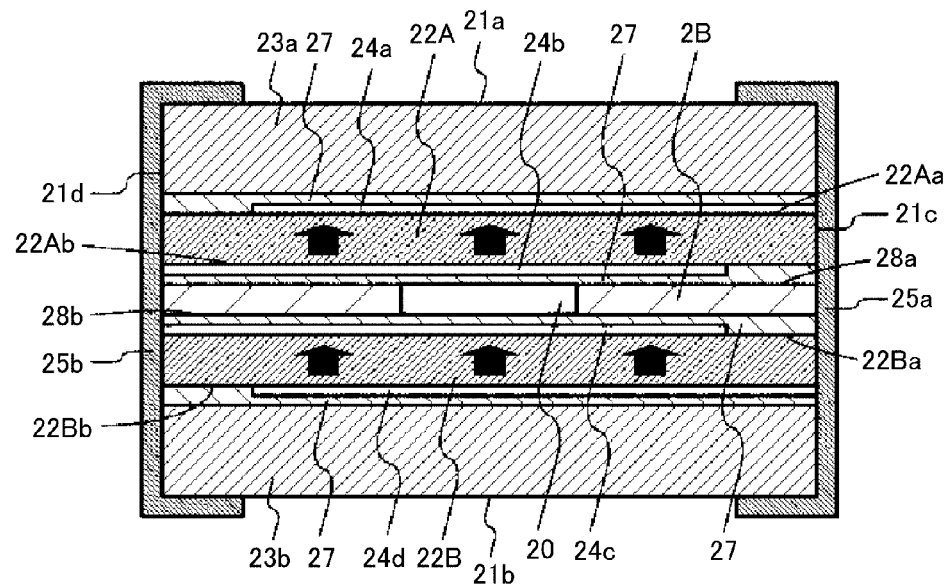
FIG. 5 is a cross-sectional view of a piezoelectric element according to a second preferred embodiment of the present invention.

FIG. 5 is a cross-sectional view of a piezoelectric element 21 according to the second preferred embodiment of the present invention.

As illustrated in FIG. 5, a pair of elastic layers 28 (one of them corresponds to a first elastic layer and the other one of them corresponds to a second elastic layer) is provided between a first piezoelectric layer 22A and a second piezoelectric layer 22B and near end surfaces of the piezoelectric element 21 in the length direction. An adhesive layer 20 is provided between the first piezoelectric layer 2A and the second piezoelectric layer 2B and in a center portion of the piezoelectric element 21 in the length direction.

In the above-described piezoelectric element 1 according to the first preferred embodiment, the elastic layer 8 is provided across an entire surface between the first piezoelectric layer 2A and the second piezoelectric layer 2B using the adhesive 7 applied to both surfaces of the elastic layer 8. However, delamination may occur between the elastic layer 8 and the first piezoelectric layer 2A and between the elastic layer 8 and the second piezoelectric layer 2B.

In the second preferred embodiment, as illustrated in FIG. 5, the adhesive layer 20 is provided between the first piezoelectric layer 22A and the second piezoelectric layer 22B and between a pair of the elastic layers 28 to bond the first piezoelectric layer 22A and the second piezoelectric layer 22B. As a result, the occurrence of delamination between the first piezoelectric layer 22A and the elastic layers 28 and between the second piezoelectric layer 22B and the elastic layers 28 is prevented and bonding strength is increased.

When the piezoelectric element 21 is used as a piezoelectric sensor, a tensile stress applied to the piezoelectric element 21 becomes small in the center portion of the piezoelectric element 21 where stresses are uniformly applied from the left and the right. Even if the elastic layer 28 is replaced with the adhesive layer 20 in the center portion of the piezoelectric element 21 in the length direction, a pair of the elastic layers 28 located near the end surfaces brings an effect of making a difference in the degree of expansion between the first piezoelectric layer 22A and the second piezoelectric layer 22B. It is therefore desired that a pair of the elastic layers 28 be provided between the first piezoelectric layer 22A and the second piezoelectric layer 22B and near the end surfaces in the length direction and the adhesive layer 20 be provided between the first piezoelectric layer 22A and the second piezoelectric layer 22B and in the center portion in the length direction.

As compared with the first preferred embodiment, when the piezoelectric element 21 is used as a piezoelectric sensor in the second preferred embodiment, a bond between the first piezoelectric layer 22A and the elastic layers 28 and a bond between the second piezoelectric layer 22B and the elastic layers 28 is strengthened and the occurrence of delamination is significantly reduced or prevented.

Third Preferred Embodiment

Figure 6:
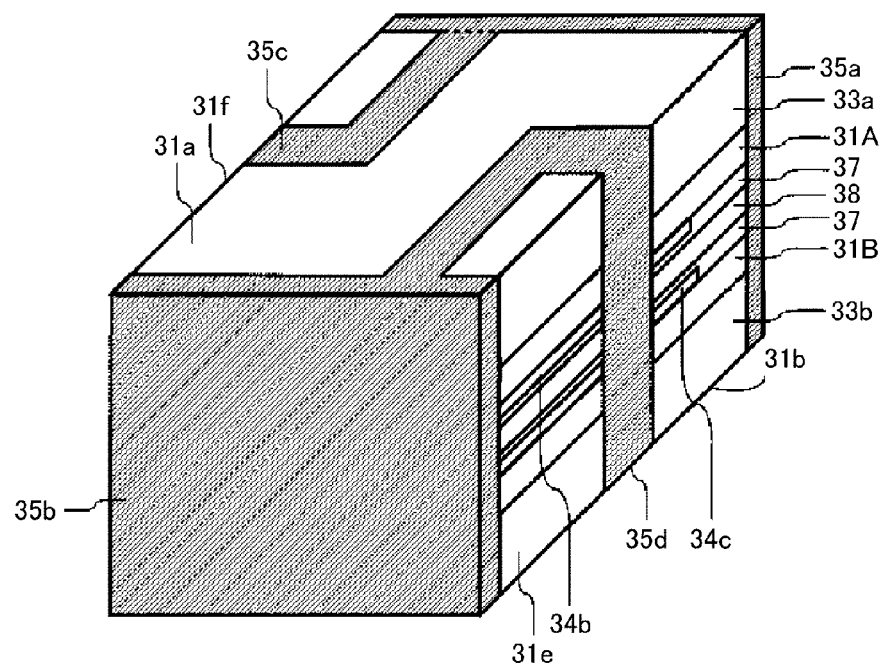
FIG. 6 is a perspective view of a piezoelectric element according to a third preferred embodiment of the present invention.

FIG. 6 is a perspective view of a piezoelectric element 31 according to the third preferred embodiment of the present invention.

As illustrated in FIG. 6, in the piezoelectric element 31, a first terminal electrode 35a includes a first extraction electrode 35c to extract a first detection electrode 34a (not illustrated) and a fourth detection electrode 34d (not illustrated) and a second terminal electrode 35b includes a second extraction electrode 35d to extract a second detection electrode 34b and a third detection electrode 34c.

The second detection electrode 34b and the third detection electrode 34c are extracted to a first side surface 31e by the second extraction electrode 35d so as to cover a center portion of an elastic layer 38 in the length direction, are further extracted to a first main surface 31a, and are connected to the second terminal electrode 35b. Although not all are illustrated, the first detection electrode 34a and the fourth detection electrode 34d are similarly extracted to a second side surface 31f by the first extraction electrode 35c so as to cover a center portion of the elastic layer 38 in the length direction, are further extracted to the first main surface 31a, and are connected to the first terminal electrode 35a.

On the one hand the elastic layer 38 absorbs a tensile stress to increase the sensitivity of a piezoelectric sensor, but on the other hand the elastic layer 38 easily deforms and is easily subjected to thermal expansion. A break therefore tends to occur between the first terminal electrode 35a and each of the first detection electrode 34a and the fourth detection electrode 34d which are provided on the elastic layer 38. Similarly, a break tends to occur between the second terminal electrode 35b and each of the second detection electrode 34b and the third detection electrode 34c.

In the third preferred embodiment, the first terminal electrode 35a and each of the first detection electrode 34a and the fourth detection electrode 34d are connected by the first extraction electrode 35c, and the second terminal electrode 35b and each of the second detection electrode 34b and the third detection electrode 34c are connected by the second extraction electrode 35d. As a result, the occurrence of a fault caused by a break is significantly reduced or prevented. That is, even if a break occurs on the side of an end surface, the electric connection between a terminal electrode and a detection electrode is able to be established on a side surface.

Also in a case where the adhesive layer 20 is provided in the center portion of the piezoelectric element 21 in the length direction between the first piezoelectric layer 22A and the second piezoelectric layer 22B like in the piezoelectric element 21 according to the second preferred embodiment, the first extraction electrode 35c and the second extraction electrode 35d are preferably provided to cover the adhesive layer 20. In this case, the occurrence of a fault caused by a break is further reduced or prevented because the adhesive layer 20 is less deformable and is less subjected to thermal expansion than the elastic layer 38.

As compared with the piezoelectric element 1 according to the first preferred embodiment and the piezoelectric element 21 according to the second preferred embodiment, when the piezoelectric element 31 according to the third preferred embodiment is used as a piezoelectric sensor, the occurrence of a fault due to a break between a detection electrode and a terminal electrode which is caused by delamination is significantly reduced or prevented.

Fourth Preferred Embodiment

Figure 7:
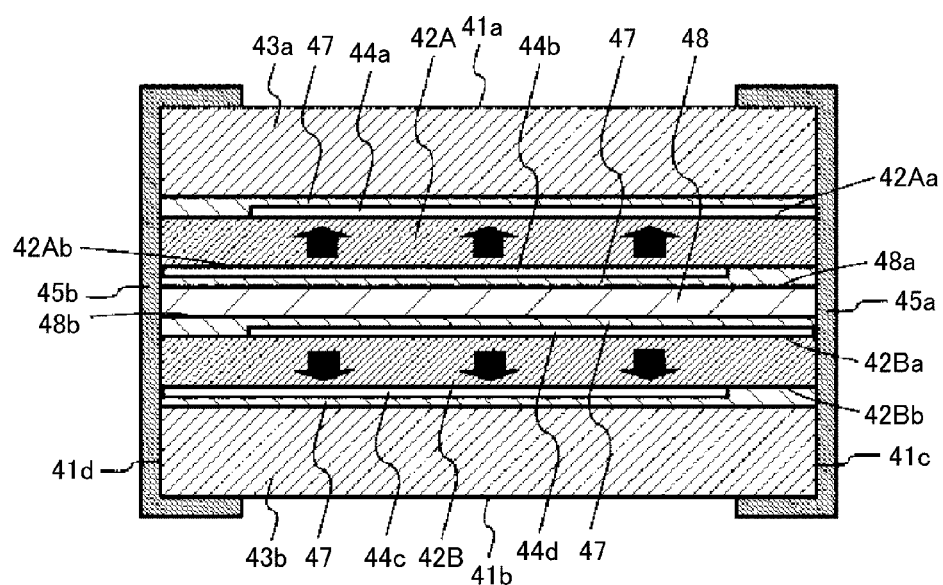
FIG. 7 is a cross-sectional view of a piezoelectric element according to a fourth preferred embodiment of the present invention.

FIG. 7 is a cross-sectional view of a piezoelectric element 41 according to the fourth preferred embodiment of the present invention.

As illustrated in FIG. 7, also in the piezoelectric element 41, a first piezoelectric layer 42A and a second piezoelectric layer 42B are subjected to polarization processing. In the first piezoelectric layer 42A and the second piezoelectric layer 42B, the thickness direction is set as a polarization direction. More specifically, the polarization direction of the first piezoelectric layer 42A is a direction from a second main surface 42Ab to a first main surface 42Aa of the first piezoelectric layer 42A and the polarization direction of the second piezoelectric layer 42B is a direction from a first main surface 42Ba to a second main surface 42Bb of the second piezoelectric layer 42B. In this case, the first main surface 42Aa of the first piezoelectric layer 42A and the second main surface 42Bb of the second piezoelectric layer 42B are positive polar surfaces, and the second main surface 42Ab of the first piezoelectric layer 42A and the first main surface 42Ba of the second piezoelectric layer are negative polar surfaces.

The polarization direction of the first piezoelectric layer 42A may be a direction from the first main surface 42Aa to the second main surface 42Ab of the first piezoelectric layer 42A, and the polarization direction of the second piezoelectric layer 42B may be a direction from the second main surface 42Bb to the first main surface 42Ba of the second piezoelectric layer 42B. In this case, the second main surface 42Ab of the first piezoelectric layer 42A and the first main surface 42Ba of the second piezoelectric layer 42B are positive polar surfaces, and the first main surface 42Aa of the first piezoelectric layer 42A and the second main surface 42Bb of the second piezoelectric layer 42B are negative polar surfaces.

In the piezoelectric element 41, a first detection electrode 44a is provided on the positive polar surface of first piezoelectric layer 42A and a second detection electrode 44b is provided on the negative polar surface of the first piezoelectric layer 42A. In addition, in the piezoelectric element 41, a third detection electrode 44c is provided on the positive polar surface of the second piezoelectric layer 42B and a fourth detection electrode 44d is disposed on the negative polar surface of the second piezoelectric substance 42B.

In addition, in the piezoelectric element 41, the first detection electrode 44a and the fourth detection electrode 44d are electrically connected to a first terminal electrode 45a, and the second detection electrode 44b and the third detection electrode 44c are electrically connected to a second terminal electrode 45b.

Also in the piezoelectric element 41 according to the fourth preferred embodiment, an electric charge generated in accordance with a heat is able to be canceled because the piezoelectric element 41 has an equivalent circuit according to the first preferred embodiment illustrated in FIG. 6.

In the fourth preferred embodiment, the second detection electrode 44b and the fourth detection electrode 44d are close to each other. It is therefore desired that an elastic layer 48 be made of an insulating material.

The characteristic configurations of piezoelectric elements according to the first to fourth preferred embodiments and a piezoelectric sensor including the piezoelectric element will be summarized as follows.

A piezoelectric element includes a laminate, a first terminal electrode, and a second terminal electrode. The laminate includes a first piezoelectric layer, a second piezoelectric layer, and an elastic layer which are laminated in the thickness direction. The first terminal electrode and the second terminal electrode are provided on the external surface of the laminate. The elastic layer is located between the first piezoelectric layer and the second piezoelectric layer. The first piezoelectric layer and the second piezoelectric layer have polarization directions in the thickness direction. The laminate further includes a first detection electrode provided on a positive polar surface of the first piezoelectric layer, a second detection electrode provided on a negative polar surface of the first piezoelectric layer, a third detection electrode provided on a positive polar surface of the second piezoelectric layer, and a fourth detection electrode provided on a negative polar surface of the second piezoelectric layer. The first detection electrode and the fourth detection electrode are connected to the first terminal electrode. The second detection electrode and the third detection electrode are connected to the second terminal electrode.

In the piezoelectric element, the polarization direction of the first piezoelectric layer and the polarization direction of the second piezoelectric layer are preferably the same.

In the piezoelectric element, the laminate may include a first main surface and a second main surface that face each other in the thickness direction, a first end surface and a second end surface that face each other in a length direction perpendicular to the thickness direction, a first side surface and a second side surface that face each other in a width direction perpendicular to the thickness direction and the length direction. In this case, a dimension of the laminate in the length direction is preferably larger than that of the laminate in the width direction.

In the piezoelectric element, the elastic layer preferably includes a first elastic layer provided near the first end surface and a second elastic layer provided near the second end surface. In this case, an adhesive layer is preferably provided between the first elastic layer and the second elastic layer.

In the piezoelectric element, the first detection electrode and the fourth detection electrode may reach each of the first end surface and the first side surface, and the second detection electrode and the third detection electrode may reach each of the second end surface and the second side surface. In this case, the first terminal electrode is preferably provided in a portion on the first side surface where the first detection electrode and the fourth detection electrode are located and on the first end surface, and the second terminal electrode is preferably provided in a portion on the second side surface where the second detection electrode and the third detection electrode are located and on the second end surface.

In the piezoelectric element, the first detection electrode and the fourth detection electrode are preferably connected to the first terminal electrode in a center portion of the first side surface in the length direction, and the second detection electrode and the third detection electrode are preferably connected to the second terminal electrode in a center portion of the second side surface in the length direction.

A piezoelectric sensor includes a deformation detection target object and any one of the above-described piezoelectric elements. The piezoelectric element is disposed on the target object.

In the piezoelectric sensor, the second piezoelectric layer may be located closer to the target object than the first piezoelectric layer. In this case, on the basis of a difference in the degree of expansion between the first piezoelectric layer and the second piezoelectric layer which is generated by the elastic layer included in the laminate, the deformation of the target object is detected.

The piezoelectric sensor may further include a joint that connects the target object and the piezoelectric element. In this case, the joint is preferably located below a height position at which the first piezoelectric layer is provided in portions corresponding to the first end surface and the second end surface of the laminate.

The present invention is not limited to the first to fourth preferred embodiments. For example, in a modification, piezoelectric monocrystal may be used as a material for the first piezoelectric layer and the second piezoelectric layer. Three or more piezoelectric layers may be provided. In addition to the first piezoelectric layer and the second piezoelectric layer, a third piezoelectric layer and a fourth piezoelectric layer may be provided. Another layer may be provided between the elastic layer and the first piezoelectric layer and between the elastic layer and the second piezoelectric layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric element comprising:
    a laminate including a first piezoelectric layer and a second piezoelectric layer with respective polarization directions in a thickness direction and an elastic layer provided between the first piezoelectric layer and the second piezoelectric layer;
    a first terminal electrode and a second terminal electrode which are provided on an external surface of the laminate;
    a first detection electrode provided on a positive polar surface of the first piezoelectric layer;
    a second detection electrode provided on a negative polar surface of the first piezoelectric layer;
    a third detection electrode provided on a positive polar surface of the second piezoelectric layer; and
    a fourth detection electrode provided on a negative polar surface of the second piezoelectric layer; wherein
    the first detection electrode and the fourth detection electrode are connected to the first terminal electrode;
    the second detection electrode and the third detection electrode are connected to the second terminal electrode; and
    a Young's modulus of the elastic layer is lower than a Young's modulus of each of the first piezoelectric layer and the second piezoelectric layer.

2. The piezoelectric element according to claim 1, wherein the first piezoelectric layer and the second piezoelectric layer have a same polarization direction.

3. The piezoelectric element according to claim 1, wherein
    the elastic layer is provided between the first piezoelectric layer and the second piezoelectric layer and near end surfaces in a length direction; and
    an adhesive layer is provided between the first piezoelectric layer and the second piezoelectric layer and in a center portion in the length direction.

4. The piezoelectric element according to claim 1, wherein
    the first, second, third, and fourth detection electrodes are exposed on portions of end surfaces and side surfaces of the laminate; and
    the first and second terminal electrodes are provided on portions of the end surfaces and the side surfaces of the laminate.

5. The piezoelectric element according to claim 1, wherein
    the first terminal electrode is connected to at least one of the first and fourth detection electrodes in a center portion of a first side surface of the laminate in the length direction; and
    the second terminal electrode is connected to at least one of the second and third detection electrodes in a center portion of a second side surface of the laminate in the length direction.

6. The piezoelectric element according to claim 1, wherein the laminate further includes a first exterior body disposed on the first piezoelectric layer and a second exterior body disposed on the second piezoelectric layer.

7. The piezoelectric element according to claim 1, wherein each of the first piezoelectric layer and the second piezoelectric layer is made of lead zirconate titanate.

8. The piezoelectric element according to claim 1, wherein the elastic layer is made of a urethane resin or a silicone resin.

9. The piezoelectric element according to claim 1, wherein the elastic layer is provided across an entire surface between the first piezoelectric layer and the second piezoelectric layer.

10. A piezoelectric sensor comprising:
    the piezoelectric element according to claim 1; and
    a deformation detection target object on which the piezoelectric element is disposed.

11. The piezoelectric sensor according to claim 10, wherein
    the second piezoelectric layer is provided closer to the target object than the first piezoelectric layer; and
    deformation of the target object is detected based on a difference in a degree of expansion between the first piezoelectric layer and the second piezoelectric layer which is generated by the elastic layer.

12. The piezoelectric sensor according to claim 10, wherein
    the piezoelectric element is connected to the target object via a joint; and
    the joint is located below a height position at which the first piezoelectric layer is provided on end surfaces of the piezoelectric element.

13. The piezoelectric sensor according to claim 10, wherein the first piezoelectric layer and the second piezoelectric layer have a same polarization direction.

14. The piezoelectric sensor according to claim 10, wherein
    the elastic layer is provided between the first piezoelectric layer and the second piezoelectric layer and near end surfaces in a length direction; and
    an adhesive layer is provided between the first piezoelectric layer and the second piezoelectric layer and in a center portion in the length direction.

15. The piezoelectric sensor according to claim 10, wherein
    the first, second, third, and fourth detection electrodes are exposed on portions of end surfaces and side surfaces of the laminate; and the first and second terminal electrodes are provided on portions of the end surfaces and the side surfaces of the laminate.

16. The piezoelectric sensor according to claim 10, wherein
the first terminal electrode is connected to at least one of the first and fourth detection electrodes in a center portion of a first side surface of the laminate in the length direction; and
the second terminal electrode is connected to at least one of the second and third detection electrodes in a center portion of a second side surface of the laminate in the length direction.

17. The piezoelectric sensor according to claim 10, wherein the laminate further includes a first exterior body disposed on the first piezoelectric layer and a second exterior body disposed on the second piezoelectric layer.

18. The piezoelectric sensor according to claim 10, wherein each of the first piezoelectric layer and the second piezoelectric layer is made of lead zirconate titanate.

19. The piezoelectric sensor according to claim 10, wherein the elastic layer is made of a urethane resin or a silicone resin.

20. The piezoelectric sensor according to claim 10, wherein the elastic layer is provided across an entire surface between the first piezoelectric layer and the second piezoelectric layer.

* * * * *